(12) United States Patent
Nakahata

(10) Patent No.: US 12,348,218 B2  
(45) Date of Patent: Jul. 1, 2025

(54) ACOUSTIC WAVE FILTER

(71) Applicant: Murata Manufacturing Co., Ltd., Nagaokakyo (JP)

(72) Inventor: Ryosuke Nakahata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 247 days.

(21) Appl. No.: 18/205,584

(22) Filed: Jun. 5, 2023

(65) Prior Publication Data

US 2023/0412148 A1 Dec. 21, 2023

(30) Foreign Application Priority Data

Jun. 17, 2022 (JP) ................. 2022-097955

(51) Int. Cl.
*H03H 9/64* (2006.01)
*H03H 9/02* (2006.01)

(52) U.S. Cl.
CPC ...... *H03H 9/6436* (2013.01); *H03H 9/02574* (2013.01); *H03H 9/02661* (2013.01); *H03H 9/6413* (2013.01)

(58) Field of Classification Search
CPC ............. H03H 9/6436; H03H 9/02574; H03H 9/02661; H03H 9/6413; H03H 9/14582; H03H 9/6483; H03H 9/6476; H03H 9/125; H03H 9/02543
USPC ................................................ 333/193–196
See application file for complete search history.

(56) References Cited

U.S. PATENT DOCUMENTS

| | | |
|---|---|---|
| 2008/0024246 A1 | 1/2008 | Kaneda et al. |
| 2018/0069529 A1 | 3/2018 | Bi et al. |
| 2019/0044496 A1* | 2/2019 | Takamine ............ H03H 9/6483 |
| 2021/0083644 A1 | 3/2021 | Ito et al. |
| 2021/0167750 A1 | 6/2021 | Takata |
| 2022/0014171 A1* | 1/2022 | Ozasa ................ H03H 9/02692 |
| 2022/0140809 A1 | 5/2022 | Noguchi |

FOREIGN PATENT DOCUMENTS

| | | |
|---|---|---|
| JP | 2008-35007 A | 2/2008 |
| JP | 2018038040 A | 3/2018 |
| KR | 20210030454 A | 3/2021 |
| KR | 20220018020 A | 2/2022 |
| WO | 2019022236 A1 | 1/2019 |

* cited by examiner

*Primary Examiner* — Jorge L Salazar, Jr.
(74) *Attorney, Agent, or Firm* — Keating & Bennett, LLP

(57) ABSTRACT

An acoustic wave filter includes a first longitudinally coupled resonator including first and second IDT electrodes, and a second longitudinally coupled resonator including third and fourth IDT electrodes. Each IDT electrode includes a wide pitch electrode finger group and a narrow pitch electrode finger group. A number of electrode fingers in the wide pitch electrode finger group of the first IDT electrode is smaller than that in the wide pitch electrode finger group of the second IDT electrode by a percentage equal to or more than about 4.2% and equal to or less than about 23.5%. A number of the electrode fingers in the wide pitch electrode finger group of the IDT electrode third is smaller than that in the wide pitch electrode finger group of the fourth IDT electrode by a percentage equal to or more than about 9.5% and equal to or less than about 52.4%.

20 Claims, 9 Drawing Sheets

ACOUSTIC WAVE FILTER

CROSS REFERENCE TO RELATED APPLICATIONS

This application claims the benefit of priority to Japanese Patent Application No. 2022-097955 filed on Jun. 17, 2022. The entire contents of this application are hereby incorporated herein by reference.

BACKGROUND OF THE INVENTION

1. Field of the Invention

The present invention relates to an acoustic wave filter including a plurality of longitudinally coupled resonators.

2. Description of the Related Art

An existing acoustic wave filter including a plurality of longitudinally coupled resonators has been known. As an example of this type of acoustic wave filter, Japanese Unexamined Patent Application Publication No. 2008-35007 discloses an acoustic wave filter including two longitudinally coupled resonators connected in parallel. In this acoustic wave filter, the numbers of electrode fingers of the IDT electrode included in the longitudinally coupled resonator differ between one longitudinally coupled resonator and the other longitudinally coupled resonator.

SUMMARY OF THE INVENTION

However, when the numbers of electrode fingers largely differ between the one longitudinally coupled resonator and the other longitudinally coupled resonator, ripples, which are unnecessary and undesirable waves, may occur in the pass band of the acoustic wave filter.

Preferred embodiments of the present invention provide acoustic wave filters each capable of reducing or preventing ripples in a pass band.

An acoustic wave filter according to an aspect of a preferred embodiment of the present invention includes a plurality of longitudinally coupled resonators, in which the plurality of longitudinally coupled resonators includes a first longitudinally coupled resonator and a second longitudinally coupled resonator that are connected to each other, each of the first longitudinally coupled resonator and the second longitudinally coupled resonator includes three IDT electrodes that include a plurality of electrode fingers extending in a first direction along a main surface of a substrate and aligned in a second direction intersecting the first direction, the first longitudinally coupled resonator includes the three IDT electrodes provided along the second direction, a first IDT electrode of the three IDT electrodes is at a center in the second direction, and a second IDT electrode of the three IDT electrodes is adjacent to the first IDT electrode, the second longitudinally coupled resonator includes the three IDT electrodes provided along the second direction, a third IDT electrode of the three IDT electrodes is at a center in the second direction, and a fourth IDT electrode is adjacent to the third IDT electrode, each of the IDT electrodes includes a wide pitch electrode finger group with a pitch equal to or larger than a mean value of pitches of the plurality of electrode fingers and a narrow pitch electrode finger group with a pitch less than the mean value, and a number of the electrode fingers included in the wide pitch electrode finger group of the first IDT electrode is smaller than a number of the electrode fingers included in the wide pitch electrode finger group of the third IDT electrode by a percentage within a range of equal to or more than about 4.2% and equal to or less than about 23.5%, and/or a number of the electrode fingers included in the wide pitch electrode finger group of the second IDT electrode is smaller than a number of the electrode fingers included in the wide pitch electrode finger group of the fourth IDT electrode by a percentage within a range of equal to or more than about 9.5% and equal to or less than about 52.4%.

According to the acoustic wave filters of preferred embodiments of the present invention, it is possible to reduce or prevent ripples in the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
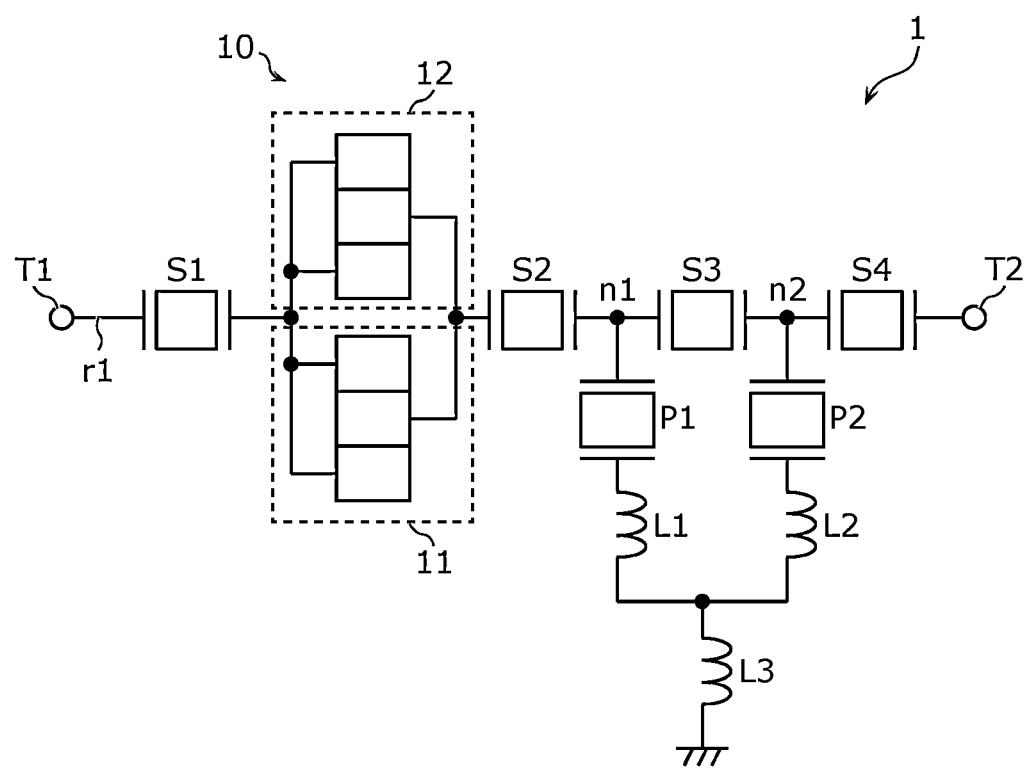
FIG. 1 is a circuit configuration diagram of an acoustic wave filter according to a preferred embodiment of the present invention.

Hereinafter, preferred embodiments of the present invention will be described in detail with reference to the accompanying drawings. Note that each of the preferred embodiments described below shows a comprehensive or specific example. Numerical values, shapes, materials, components, arrangement and connection mode of the components, and the like shown in the following preferred embodiments are mere examples, and are not intended to limit the present invention. Among the elements or features in the following preferred embodiments, elements or features not recited in the independent claims are described as optional elements or features. In addition, sizes or ratios of sizes of components illustrated in the drawings are not necessarily strict. In addition, in the drawings, substantially the same components are denoted by the same reference numerals, and redundant description thereof may be omitted or simplified. In addition, in the following preferred embodiments, "being connected" includes not only a case of direct connection but also a case of electrical connection via another element or the like.

PREFERRED EMBODIMENT

Configuration of Acoustic Wave Filter

A configuration of an acoustic wave filter according to a preferred embodiment will be described with reference to FIG. 1 and FIG. 2.

FIG. 1 is a circuit configuration diagram of an acoustic wave filter 1 according to a preferred embodiment.

The acoustic wave filter 1 is a filter having a first frequency band as a pass band. The acoustic wave filter 1 is provided on a path r1 connecting input/output terminals T1 and T2.

The input/output terminal T1 is connected to one end of the acoustic wave filter 1. For example, the input/output terminal T1 is connected to an antenna element outside the acoustic wave filter 1. The input/output terminal T1 is also an antenna terminal of the acoustic wave filter 1.

The input/output terminal T2 is connected to the other end of the acoustic wave filter 1. For example, the input/output terminal T2 is connected to an RF-signal processing circuit (not shown) via an amplifier circuit or the like (not shown) outside the acoustic wave filter 1.

The acoustic wave filter 1 is, for example, a reception filter whose pass band is a downlink frequency band (reception band). The pass band of the acoustic wave filter 1 of the present preferred embodiment is equal to or more than about 1427 MHz and equal to or less than about 1517 MHz, for example.

The acoustic wave filter 1 includes a plurality of series arm resonators S1, S2, S3, and S4, a longitudinally coupled resonator group 10 including a plurality of longitudinally coupled resonators 11 and 12, and a plurality of parallel arm resonators P1 and P2. The series arm resonator S1, the longitudinally coupled resonator group 10, and the series arm resonators S2, S3, and S4 are connected in series in this order from the input/output terminal T1 to the input/output terminal T2.

The series arm resonator S1 is arranged on the path r1 between the input/output terminal T1 and the longitudinally coupled resonator group 10 and are connected to one end of the longitudinally coupled resonator group 10. The series arm resonator S2 is arranged on the path r1 between the longitudinally coupled resonator group 10 and the input/output terminal T2, and is connected to the other end of the longitudinally coupled resonator group 10.

The parallel arm resonator P1 is arranged on a path connecting a node n1 between the series arm resonators S2 and S3 on the path r1 and a reference terminal (ground). To be specific, one end of the parallel arm resonator P1 is connected to the node n1, and the other end thereof is connected to the reference terminal via inductors L1 and L3. The parallel arm resonator P2 is arranged on a path connecting a node n2 between the series arm resonators S3 and S4 on the path r1 and the reference terminal. To be specific, one end of the parallel arm resonator P2 is connected to the node n2, and the other end thereof is connected to the reference terminal via an inductor L2 and the inductor L3. The inductors L1 and L2 are commonly connected and connected to the inductor L3.

Note that the series arm resonators and the parallel arm resonators of the acoustic wave filter 1 are not limited to four series arm resonators and two parallel arm resonators and may include one or more series arm resonators and one or more parallel arm resonators. Further, the inductor need not be provided between the parallel arm resonator and the reference terminal.

The longitudinally coupled resonator group 10 is arranged on the path r1 between the series arm resonators S1 and S2. The longitudinally coupled resonator group 10 includes the first longitudinally coupled resonator 11 and the second longitudinally coupled resonator 12 that are connected to each other. The first longitudinally coupled resonator 11 and the second longitudinally coupled resonator 12 of the present preferred embodiment are connected in parallel.

Figure 2:
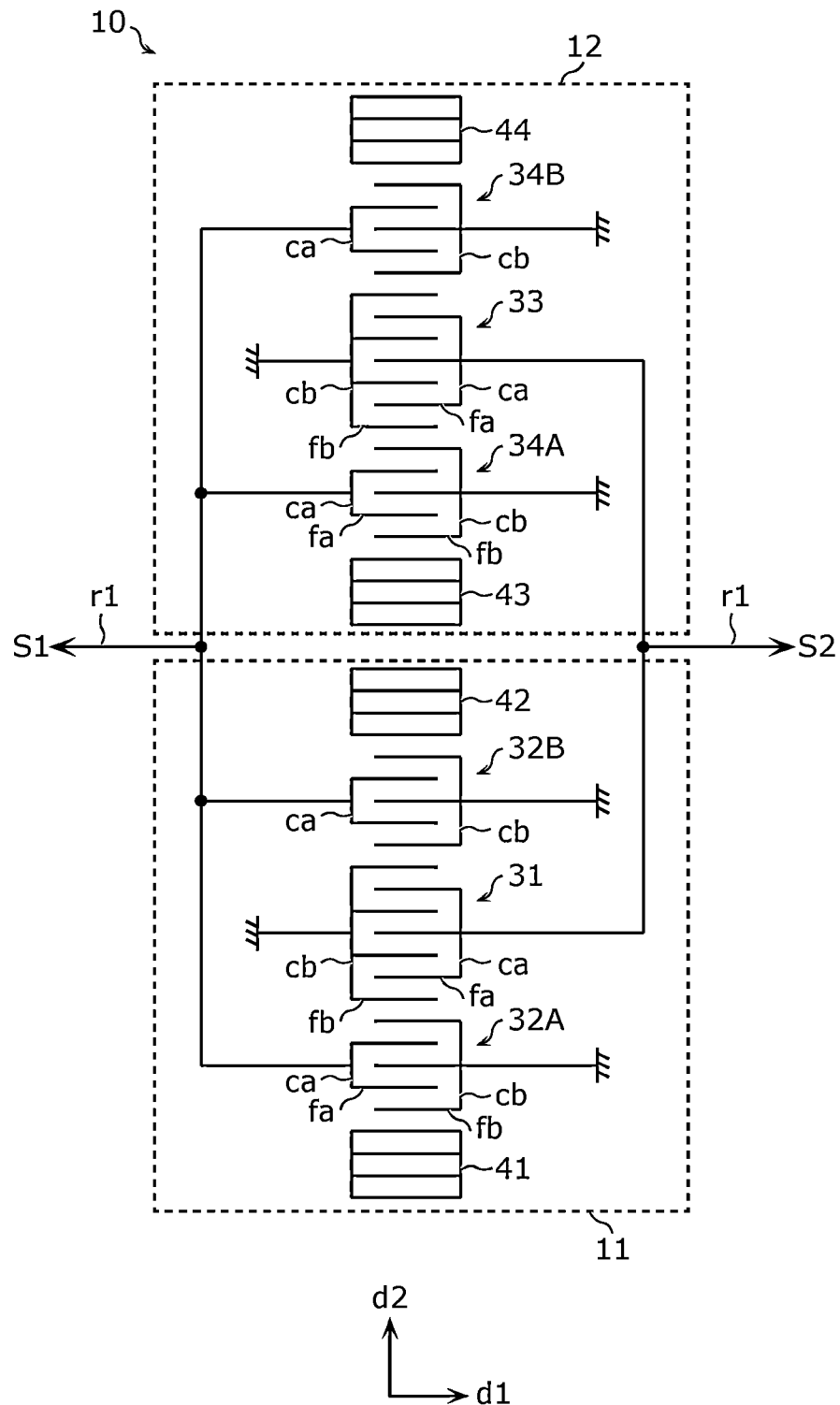
FIG. 2 is a schematic diagram illustrating a plurality of longitudinally coupled resonators included in an acoustic wave filter according to a preferred embodiment of the present invention.

FIG. 2 is a schematic diagram illustrating the plurality of longitudinally coupled resonators 11 and 12 included in the acoustic wave filter 1. Note that in FIG. 2, electrodes and wirings are indicated by solid lines.

Each of the longitudinally coupled resonators 11 and 12 includes a plurality of surface acoustic wave (SAW) resonators. The surface acoustic wave resonator includes a substrate 320 to be described later and an interdigital transducer (IDT) electrode provided on the substrate 320.

As illustrated in FIG. 2, the longitudinally coupled resonator 11 includes a first IDT electrode 31 and second IDT electrodes 32A and 32B. The longitudinally coupled resonator 12 includes a third IDT electrode 33 and fourth IDT electrodes 34A and 34B. The third IDT electrode 33 corresponds to the first IDT electrode 31, the fourth IDT electrode 34A corresponds to the second IDT electrode 32A, and the fourth IDT electrode 34B corresponds to the second IDT electrode 32B. Hereinafter, some or all of the IDT electrodes 31, 32A, 32B, 33, 34A, and 34B may be referred to as an IDT electrode 30.

The IDT electrode 30 includes a plurality of electrode fingers fa and fb. The electrode fingers fa and fb extend in a first direction d1 along the main surface of the substrate 320 and are aligned in a second direction d2 intersecting the first direction d1. The second direction d2 of the present preferred embodiment is the same direction as the acoustic wave propagation direction of each of the longitudinally coupled resonators 11 and 12 and is orthogonal to the first direction d1.

The IDT electrode 30 includes a pair of comb-shaped electrodes ca and cb facing each other. The comb-shaped electrode ca has a comb-like shape and includes the plurality of electrode fingers fa parallel to each other and a busbar electrode connecting one ends of the plurality of electrode fingers fa to each other. The comb-shaped electrode cb has a comb-like shape and includes the plurality of electrode fingers fb parallel to each other and a busbar electrode connecting one ends of the plurality of electrode fingers fb to each other. Each of the busbar electrodes extend along the second direction d2. The electrode finger fa and the electrode finger fb are interdigitated with each other in the first direction d1 and face each other in the second direction d2.

The longitudinally coupled resonator 11 includes three IDT electrodes 30 arranged along the second direction d2. Of the three IDT electrodes 30 of the longitudinally coupled resonator 11, the first IDT electrode 31 is arranged at the center in the second direction d2, and the second IDT electrodes 32A and 32B are arranged adjacent to the first IDT electrode 31. The IDT electrode 32A, the IDT electrode 31, and the IDT electrode 32B are arranged in this order along the second direction d2. In other words, in the second direction d2, the IDT electrode 31 is arranged between the two IDT electrodes 32A and 32B, and the two IDT electrodes 32A and 32B are arranged on both outer side portions of the IDT electrode 31. In addition, the longitudinally coupled resonator 11 includes a plurality of reflectors 41 and 42. The reflectors 41 and 42 are arranged on both outer side portions of the IDT electrodes 32A, 31, and 32B so as to sandwich the IDT electrodes 32A, 31, and 32B in the second direction d2.

The longitudinally coupled resonator 12 includes three IDT electrodes 30 arranged along the second direction d2. Of the three IDT electrodes 30 of the longitudinally coupled resonator 12, the third IDT electrode 33 is arranged at the center in the second direction d2, and the fourth IDT electrodes 34A and 34B are arranged adjacent to the third IDT electrode 33. The IDT electrode 34A, the IDT electrode 33, and the IDT electrode 34B are arranged in this order along the second direction d2. In other words, in the second direction d2, the IDT electrode 33 is arranged between the two IDT electrodes 34A and 34B, and the two IDT electrodes 34A and 34B are arranged on both outer side portions of the IDT electrode 33. In addition, the longitudinally coupled resonator 12 includes a plurality of reflectors 43 and 44. The reflectors 43 and 44 are arranged on both outer side portions of the IDT electrodes 34A, 33, and 34B so as to sandwich the IDT electrodes 34A, 33, and 34B in the second direction d2. The reflectors 42 and 43 are arranged adjacent to each other in the second direction d2.

The IDT electrodes 32A, 32B, 34A, and 34B are connected to the path r1 on the input/output terminal T1 side when viewed from the longitudinally coupled resonator group 10. To be specific, the comb-shaped electrode ca of each of the IDT electrodes 32A, 32B, 34A, and 34B is extended and wired by extended wirings, and then connected to the series arm resonator S1 on the path r1. The comb-shaped electrode cb of each of the IDT electrodes 32A, 32B, 34A, and 34B is extended by the extended wirings and connected to the ground.

The IDT electrodes 31 and 33 are connected to the path r1 on the input/output terminal T2 side when viewed from the longitudinally coupled resonator group 10. To be specific, the comb-shaped electrode ca of each of the IDT electrodes 31 and 33 is extended and wired by the extended wirings, and then connected to the series arm resonator S2 on the path r1. The comb-shaped electrode cb of each of the IDT electrodes 31 and 33 is extended by the extended wirings and connected to the ground.

Structure of IDT Electrode of Longitudinally Coupled Resonator

The structure of the IDT electrode 30 of the longitudinally coupled resonators 11 and 12 will be described with reference to FIG. 3 to FIGS. 5A to 5C.

Figure 3:
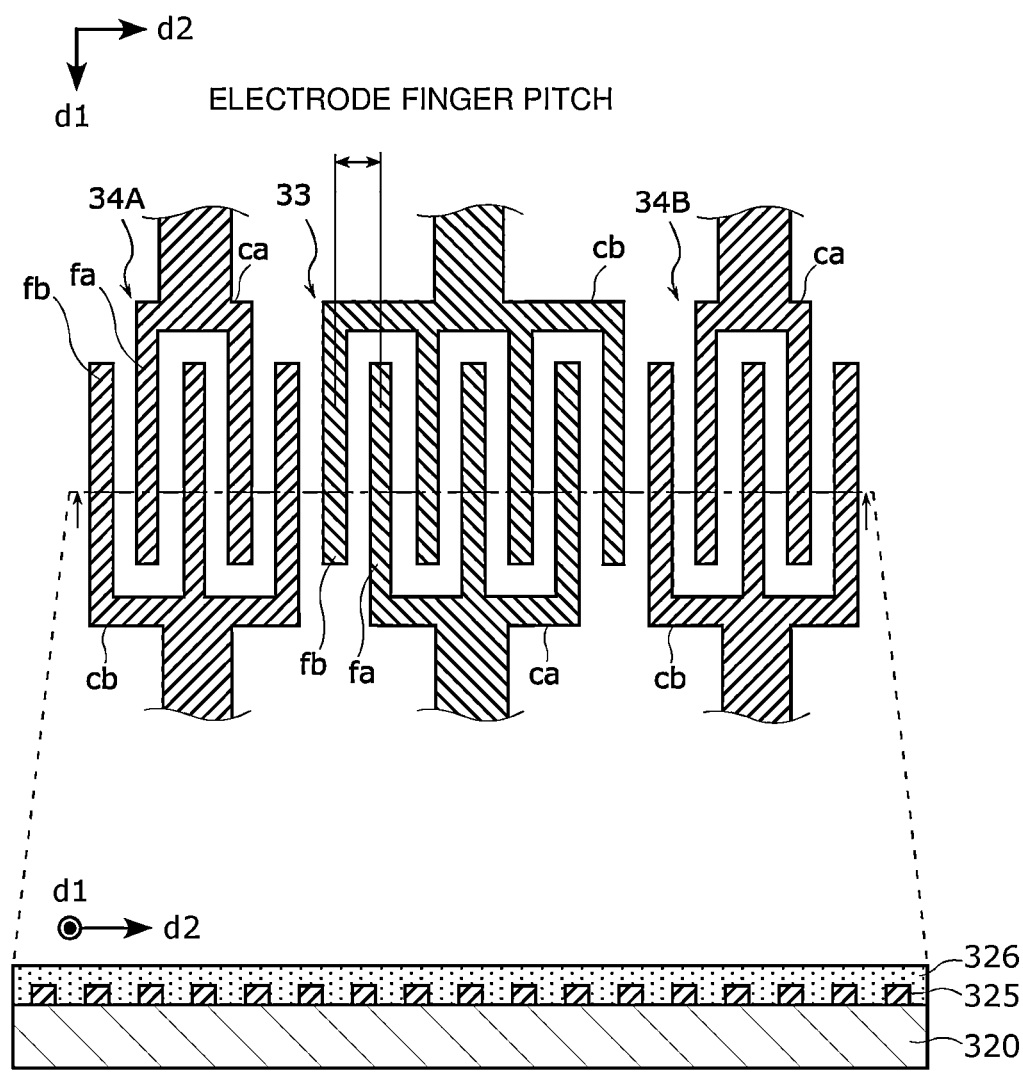
FIG. 3 includes a plan view and a cross-sectional view schematically illustrating a structure of an IDT electrode included in the plurality of longitudinally coupled resonators.

FIG. 3 includes a plan view and a cross-sectional view schematically illustrating the structure of the IDT electrode 30 included in the plurality of longitudinally coupled resonators 11 and 12. This figure illustrates the structure of the IDT electrode in a simplified manner, and the numbers and lengths of the electrode fingers included in the IDT electrode are different from those in FIG. 3.

Each of the longitudinally coupled resonators 11 and 12 includes the substrate 320 having piezoelectricity, an electrode layer 325 of the IDT electrode 30 provided on the substrate 320, and a dielectric layer 326 provided on the substrate so as to cover the IDT electrode 30.

The substrate 320 is, for example, a LiNbO$_3$ substrate (lithium niobate substrate) having a cut angle of about 127.5°, for example. When a Rayleigh wave is used as the acoustic wave propagating in the substrate 320, the cut angle of the substrate 320 is preferably about 120°±20° or 300°±20°, for example.

The electrode layer 325 has a structure in which a plurality of metal layers is stacked. The electrode layer 325 is formed by stacking, for example, a NiCr layer, a Pt layer, a Ti layer, an Al layer, and a Ti layer in this order from the bottom.

The dielectric layer 326 is, for example, a film including silica dioxide (SiO$_2$) as a main component. The dielectric layer 326 is provided for the purpose of adjusting the frequency-temperature characteristics of the IDT electrode 30, protecting the electrode layer 325 from the external environment, enhancing the moisture resistance, or the like.

Figure 4:
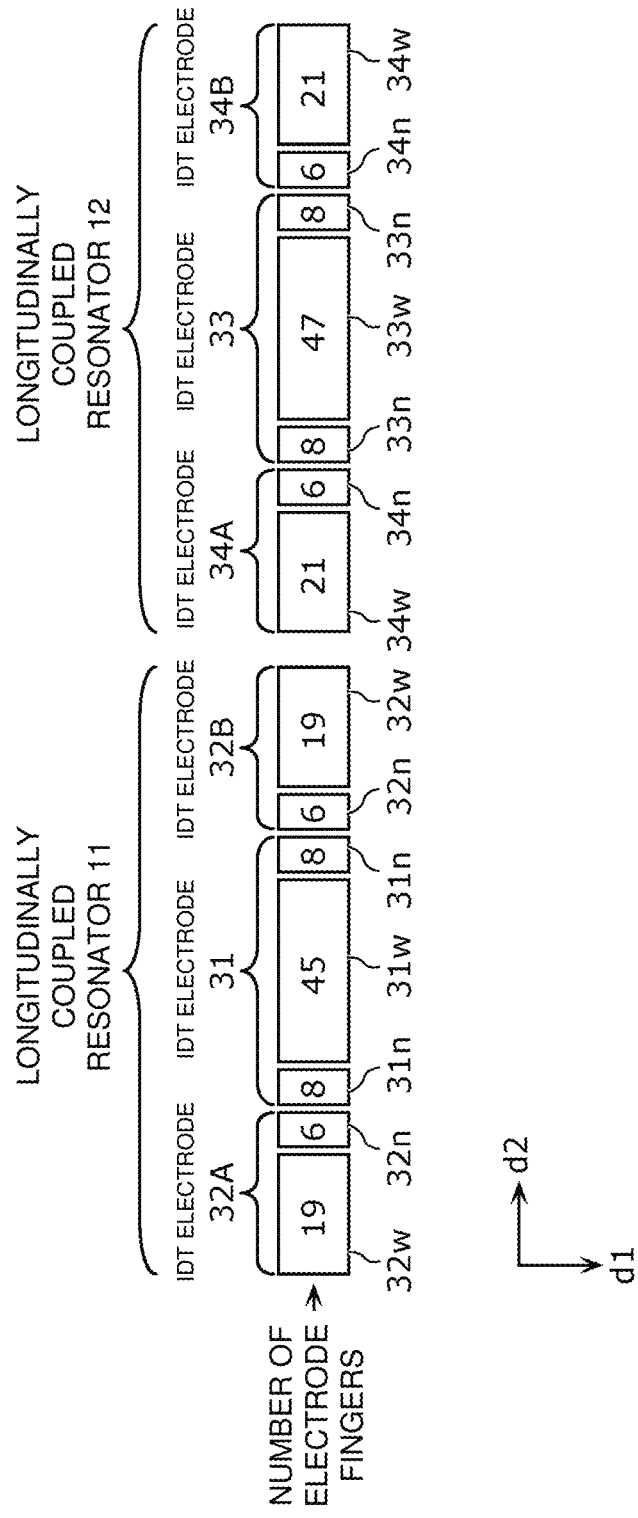
FIG. 4 is a schematic diagram illustrating numbers of electrode fingers of the IDT electrode included in the plurality of longitudinally coupled resonators.

FIG. 4 is a schematic diagram illustrating the numbers of electrode fingers fa and fb of the IDT electrode 30 included in the plurality of longitudinally coupled resonators 11 and 12. Hereinafter, the reference numerals of the electrode fingers fa and fb may be omitted and simply referred to as "electrode fingers".

As illustrated in FIG. 4, the IDT electrode 31 of the longitudinally coupled resonator 11 has 61 (=8+45+8) electrode fingers, the IDT electrode 32A has 25 (=19+6) electrode fingers, and the IDT electrode 32B has 25 (=6+19) electrode fingers. The IDT electrode 33 of the longitudinally coupled resonator 12 has 63 (=8+47+8) electrode fingers, the IDT electrode 34A has 27 (=21+6) electrode fingers, and the IDT electrode 34B has 27 (=6+21) electrode fingers. Note that the number of electrode fingers of the IDT electrode 32A and the number of electrode fingers of the IDT electrode 32B are not limited to the same number and may be different numbers. In addition, the number of electrode fingers of the IDT electrode 34A and the number of electrode fingers of the IDT electrode 34B are not limited to the same number and may be different numbers.

Each of the IDT electrodes 30 includes a wide pitch electrode finger group and a narrow pitch electrode finger group. To be specific, the IDT electrode 31 includes a wide pitch electrode finger group 31$w$ and a narrow pitch electrode finger group 31$n$. Each of the IDT electrodes 32A and 32B includes a wide pitch electrode finger group 32$w$ and a narrow pitch electrode finger group 32$n$. The IDT electrode 33 includes a wide pitch electrode finger group 33$w$ and a narrow pitch electrode finger group 33$n$. Each of the IDT electrodes 34A and 34B includes a wide pitch electrode finger group 34$w$ and a narrow pitch electrode finger group 34$n$.

The wide pitch electrode finger group is an electrode finger group having a pitch equal to or larger than the mean value of the pitches of the plurality of electrode fingers. The narrow pitch electrode finger group is an electrode finger group having a pitch less than the mean value of the pitches of the plurality of electrode fingers.

Here, the wide pitch electrode finger group, the narrow pitch electrode finger group, the pitch of the electrode fingers, and the mean value of the pitches of the electrode fingers will be described.

Figure 5A:
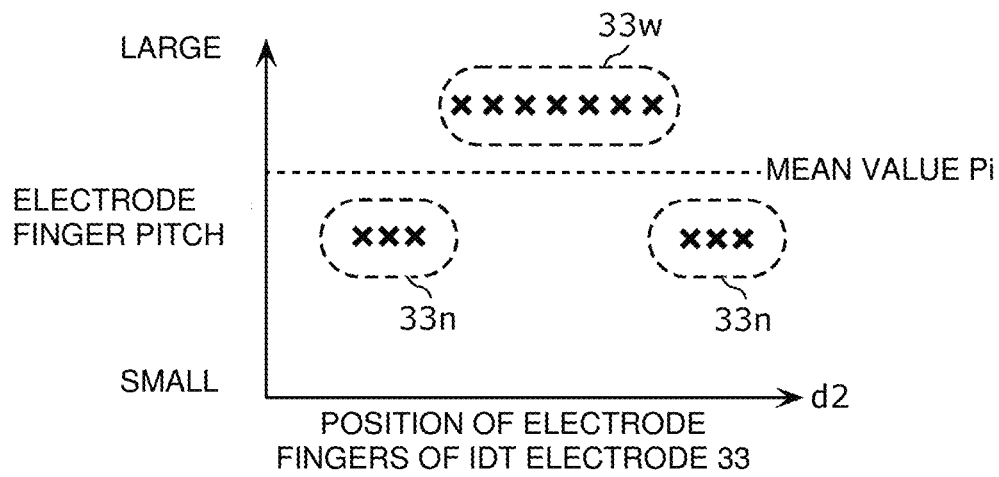
FIGS. 5A to 5C are diagrams illustrating an example of a wide pitch electrode finger group and a narrow pitch electrode finger group included in the IDT electrode.
Figure 5B:
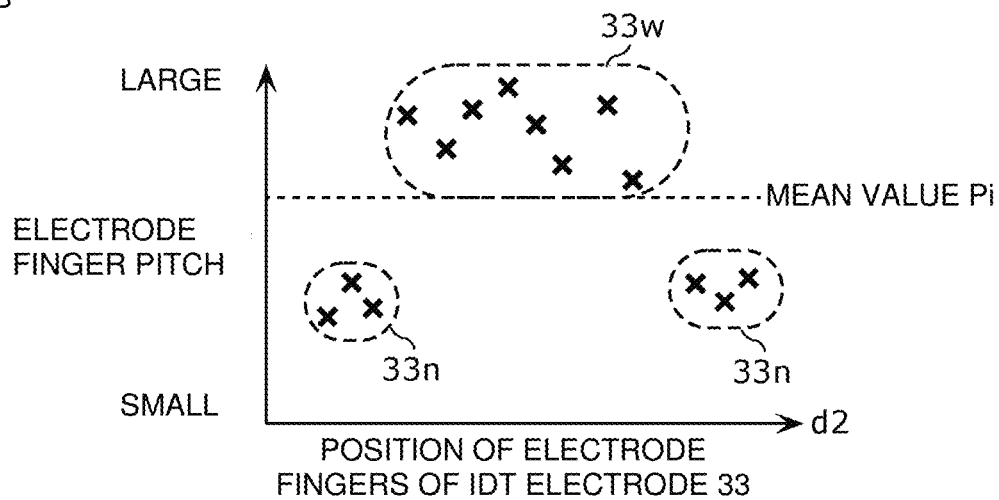
Figure 5C:
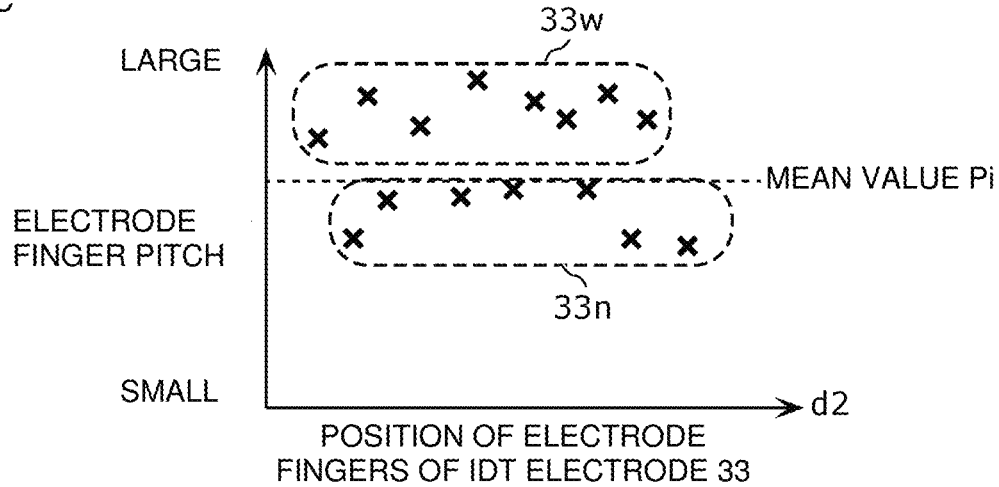

FIGS. 5A to 5C are diagrams illustrating an example of the wide pitch electrode finger group 33$w$ and the narrow pitch electrode finger group 33$n$ included in the IDT electrode 33. The horizontal axis of each figure represents the position of each of the electrode fingers along the second direction d2, and the vertical axis represents the pitch of each of the electrode fingers and a mean value Pi of the pitch of the electrode fingers.

The pitch of the electrode fingers is the distance from the center in the second direction of the electrode finger fa (or fb) to the center in the second direction of another electrode finger located adjacent thereto on the positive side in the second direction d2 (hereinafter, the distance between the centers of two electrode fingers in the second direction d2 may be simply referred to as "center-to-center distance"). Note that in the case of the electrode finger located on the most positive side in the second direction d2, the pitch is the distance from the center of the electrode finger to the center of the electrode finger of the reflector located on the positive side in the second direction d2.

The mean value Pi of the pitches of the electrode fingers is a mean value of the pitches of the electrode fingers aligned along the second direction d2. For example, the mean value Pi of the pitches of the electrode fingers of the IDT electrode 33 is the mean value of the distances between the centers of the electrode fingers adjacent to each other in the second direction d2 in the plurality of electrode fingers included in the IDT electrode 33. All the pitches of the plurality of electrode fingers in the IDT electrode 33 may be the same, or some or all of the pitches may be different. The pitch of the electrode fingers may change discontinuously such that adjacent pitches in the second direction d2 increase or decrease irregularly.

The mean value Pi of the pitch of the electrode fingers can be derived as follows. For example, the total number of electrode fingers included in the IDT electrode 33 is set to Ni. A center-to-center distance between the electrode finger located at one end of the IDT electrode 33 in the second direction d2 and the electrode finger located at the other end of the IDT electrode 33 in the second direction d2 is defined as Di. Then, the mean value Pi of the pitch can be expressed by the equation Pi=Di/(Ni−1). Note that (Ni−1) can be said to be the total number of gaps formed by adjacent electrode fingers in the IDT electrode 33. The measurement point of the pitch of the electrode fingers is determined by the distance at a substantially intermediate point in the first direction d1 of the predetermined intersecting width of the adjacent electrode fingers. Alternatively, the pitch may be obtained as a mean value of the distances at two points that divide the intersecting width into substantially equal halves or three points that divide the intersecting width into substantially equal thirds in the first direction for each electrode finger. The pitch of the electrode fingers can be measured by length measurement by optical microscope or SEM observation from the top surface (direction perpendicular to both the first direction d1 and the second direction d2), or by optical microscope or SEM observation after polishing out or the like a cross section passing through the above virtual line. The same applies to the IDT electrodes 31, 32A, 32B, 34A, and 34B as to the pitch of the electrode fingers and the mean value Pi of the pitch of the electrode fingers described above.

Next, the wide pitch electrode finger group 33w and the narrow pitch electrode finger group 33n illustrated in FIGS. 5A to 5C will be described. Note that in FIGS. 5A to 5C, the pitch of the electrode fingers is schematically illustrated for ease of understanding.

The IDT electrode 33 illustrated in FIG. 5A has the wide pitch electrode finger group 33w and the narrow pitch electrode finger group 33n adjacent to each other in the second direction d2. In this example, the narrow pitch electrode finger groups 33n are arranged on both outer side portions of the wide pitch electrode finger group 33w. The pitch of the electrode fingers of the wide pitch electrode finger group 33w is a constant pitch, and the same pitch continues in a continuous state along the second direction d2. The pitch of the electrode fingers of the narrow pitch electrode finger group 33n is a constant pitch that is smaller than the pitch of the electrode fingers of the wide pitch electrode finger group 33w, and the same pitch continues in a continuous state along the second direction d2.

The IDT electrode 33 illustrated in FIG. 5B has the wide pitch electrode finger group 33w and the narrow pitch electrode finger group 33n adjacent to each other in the second direction d2. Also in this example, the narrow pitch electrode finger groups 33n are arranged on both outer side portions of the wide pitch electrode finger group 33w. The pitch of the electrode fingers of the wide pitch electrode finger group 33w is a random pitch, and different pitches continue in a discontinuous state along the second direction d2. The pitch of the electrode fingers of the narrow pitch electrode finger group 33n is a random pitch that is smaller than the pitch of the electrode fingers of the wide pitch electrode finger group 33w, and different pitches continue in a discontinuous state along the second direction d2.

The IDT electrode 33 illustrated in FIG. 5C includes the wide pitch electrode finger group 33w and the narrow pitch electrode finger group 33n provided over the entire second direction d2. The pitch of the electrode fingers of the wide pitch electrode finger group 33w is a random pitch, and different pitches continue in a discontinuous state along the entire second direction d2. The pitch of the electrode fingers of the narrow pitch electrode finger group 33n is a random pitch that is smaller than the pitch of the electrode fingers of the wide pitch electrode finger group 33w, and different pitches continue in a discontinuous state along the entire second direction d2.

As described above, the wide pitch electrode finger group and the narrow pitch electrode finger group included in the IDT electrode may take forms illustrated in FIGS. 5A to 5C. Although the IDT electrode 33 is described above as an example, the same applies to the other IDT electrodes 31, 32A, 32B, 34A, and 34B.

Next, returning to FIG. 4, the number of wide pitch electrode finger groups of each IDT electrode 30 will be described. The wide pitch electrode finger group has a larger number of electrode fingers (for example, twice or more) than the narrow pitch electrode finger group, and is a dominant portion when the wavelength of the IDT electrode 30 is formed. Therefore, in the following description, attention is paid to the number of wide pitch electrode finger groups. In this example, description will be given by contrasting the IDT electrode 31 and the IDT electrode 33, the IDT electrode 32A and the IDT electrode 34A, and the IDT electrode 32B and the IDT electrode 34B, which are in correspondence with each other.

As illustrated in FIG. 4, the number of electrode fingers of the wide pitch electrode finger group 33w of the IDT electrode 33 is 47, and the number of electrode fingers of the wide pitch electrode finger group 31w of the IDT electrode 31 is 45. That is, the number of electrode fingers of the wide pitch electrode finger group 31w of the IDT electrode 31 is smaller than the number of electrode fingers of the wide pitch electrode finger group 33w of the IDT electrode 33 by two. In addition, the number of electrode fingers of the wide pitch electrode finger group 34w of each of the IDT electrodes 34A and 34B is 21, and the number of electrode fingers of the wide pitch electrode finger group 32w of each of the IDT electrodes 32A and 32B is 19. That is, the number of electrode fingers of the wide pitch electrode finger group 32w of each of the IDT electrodes 32A and 32B is smaller than the number of electrode fingers of the wide pitch electrode finger group 34w of each of the IDT electrodes 34A and 34B by two.

Note that although FIG. 4 illustrates an example in which the number of electrode fingers of the wide pitch electrode finger group 31w of the IDT electrode 31 is smaller than the number of electrode fingers of the wide pitch electrode finger group 33w of the IDT electrode 33 by two, the number of electrode fingers to be reduced is not limited to two and may be two or more and 11 or less (see FIG. 8 described later). In addition, although an example is shown in which the number of electrode fingers of the wide pitch electrode finger group 32w of each of the IDT electrodes 32A and 32B is smaller than the number of electrode fingers of the wide pitch electrode finger group 34w of each of the IDT electrodes 34A and 34B by two, the number of electrode fingers to be reduced is not limited to two and may be two or more and 11 or less (see FIG. 8).

In addition, the example described above is shown in which the numbers of electrode fingers of the wide pitch electrode finger groups 33w and 34w are 47 and 21, respectively, but the numbers are not limited thereto. For example, the numbers of electrode fingers of the wide pitch electrode finger groups 33w and 34w may be 94 and 42, respectively. In this example, the number of electrode fingers of the wide pitch electrode finger group 31w is reduced with respect to the number of electrode fingers of the wide pitch electrode finger group 33w, and the number of electrode fingers of the wide pitch electrode finger group 32w is reduced with respect to the number of electrode fingers of the wide pitch electrode finger group 34w, and a ratio of the number of electrode fingers to be reduced from the reference with respect to the number of electrode fingers of the wide pitch electrode finger group serving as the reference is expressed by the following equation.

Ratio of the number of electrode fingers to be reduced from the reference=(the number of electrode fingers to be reduced from the reference)/(the number of electrode fingers of the wide pitch electrode finger group serving as the reference)   (Equation 1)

Based on (Equation 1), in the relationship between the IDT electrodes 31 and 33, the ratio of the number of electrode fingers to be reduced from the reference is equal to or more than about 0.042 and equal to or less than about 0.235 (=equal to or more than 2/47 and equal to or less than 11/47, where the fourth decimal place is rounded down at the lower limit and rounded up at the upper limit). That is, the number of the electrode fingers included in the wide pitch electrode finger group 31w of the IDT electrode 31 may be smaller than the number of the electrode fingers included in the wide pitch electrode finger group 33w of the IDT electrode 33, as a reference, by a number falling within a range of equal to or more than about 4.2% and equal to or less than about 23.5%, for example. According to this configuration, unnecessary waves generated when the IDT electrode 31 and the IDT electrode 33 are excessively excited than is necessary can be appropriately dispersed in the pass band of the acoustic wave filter 1. Thus, generation of ripples in the pass band of the acoustic wave filter 1 can be reduced or prevented.

In addition, based on (Equation 1), in the relationship between the IDT electrodes 32A and 34A, the ratio of the number of electrode fingers to be reduced from the reference is equal to or more than about 0.095 and equal to or less than about 0.524 (=equal to or more than 2/21 and equal to or less than 11/21, where the fourth decimal place is rounded down at the lower limit and rounded up at the upper limit), for example. That is, the number of the electrode fingers included in the wide pitch electrode finger group 32w of the IDT electrode 32A may be smaller than the number of the electrode fingers included in the wide pitch electrode finger group 34w of the IDT electrode 34A, as a reference, by a number falling within a range of equal to or more than about 9.5% and equal to or less than about 52.4%, for example. According to this configuration, unnecessary waves generated when the IDT electrode 32A and the IDT electrode 34A are excessively excited than is necessary can be appropriately dispersed in the pass band of the acoustic wave filter 1. Thus, generation of ripples in the pass band of the acoustic wave filter 1 can be reduced or prevented.

In addition, based on (Equation 1), in the relationship between the IDT electrodes 32B and 34B, the ratio of the number of electrode fingers to be reduced from the reference is equal to or more than about 0.095 and equal to or less than about 0.524 (=equal to or more than 2/21 and equal to or less than 11/21, where the fourth decimal place is rounded down at the lower limit and rounded up at the upper limit), for example. That is, the number of the electrode fingers included in the wide pitch electrode finger group 32w of the IDT electrode 32B may be smaller than the number of the electrode fingers included in the wide pitch electrode finger group 34w of the IDT electrode 34B, as a reference, by a number falling within a range of equal to or more than about 9.5% and equal to or less than about 52.4%, for example. According to this configuration, unnecessary waves generated when the IDT electrode 32B and the IDT electrode 34B are excessively excited than is necessary can be appropriately dispersed in the pass band of the acoustic wave filter 1. Thus, generation of ripples in the pass band of the acoustic wave filter 1 can be reduced or prevented.

In the example described above, the number of electrode fingers of all the wide pitch electrode finger group 31w is smaller than the number of electrode fingers of the wide pitch electrode finger group 33w by two or more and 11 or less, and the number of electrode fingers of all the wide pitch electrode finger group 32w is smaller than the number of electrode fingers of the wide pitch electrode finger group 34w by two or more and 11 or less, but the present invention is not limited thereto. The wide pitch electrode finger group in which the number of electrode fingers is reduced is not limited to all but may be a portion thereof. For example, among all the wide pitch electrode finger groups, only the number of electrode fingers of the wide pitch electrode finger group 31w may be smaller than the number of electrode fingers of the wide pitch electrode finger group 33w by two or more and 11 or less. Only the number of electrode fingers of the wide pitch electrode finger group 32w of the IDT electrode 32A may be smaller than the number of electrode fingers of the wide pitch electrode finger group 34w of the IDT electrode 34A by two or more and 11 or less. Only the number of electrode fingers of the wide pitch electrode finger group 32w of the IDT electrode 32B may be smaller than the number of electrode fingers of the wide pitch electrode finger group 34w of the IDT electrode 34B by two or more and 11 or less.

Although an example in which the IDT electrodes 32A and 34A correspond to each other and the IDT electrodes 32B and 34B correspond to each other has been described above, the correspondence relationship may be reversed. For example, the number of electrode fingers of the wide pitch electrode finger group 32w of the IDT electrode 32A may be smaller than the number of electrode fingers of the wide pitch electrode finger group 34w of the IDT electrode 34B by two or more and 11 or less. The number of electrode fingers of the wide pitch electrode finger group 32w of the IDT electrode 32B may be smaller than the number of electrode fingers of the wide pitch electrode finger group 34w of the IDT electrode 34A by two or more and 11 or less.

Transmission Characteristics and the Like of Longitudinally Coupled Resonator Group The transmission characteristics and the like of the longitudinally coupled resonator group 10 will be described with reference to FIG. 6 to FIG. 9. First, electrode parameters of the IDT electrode included in the longitudinally coupled resonator will be described.

Figure 6:
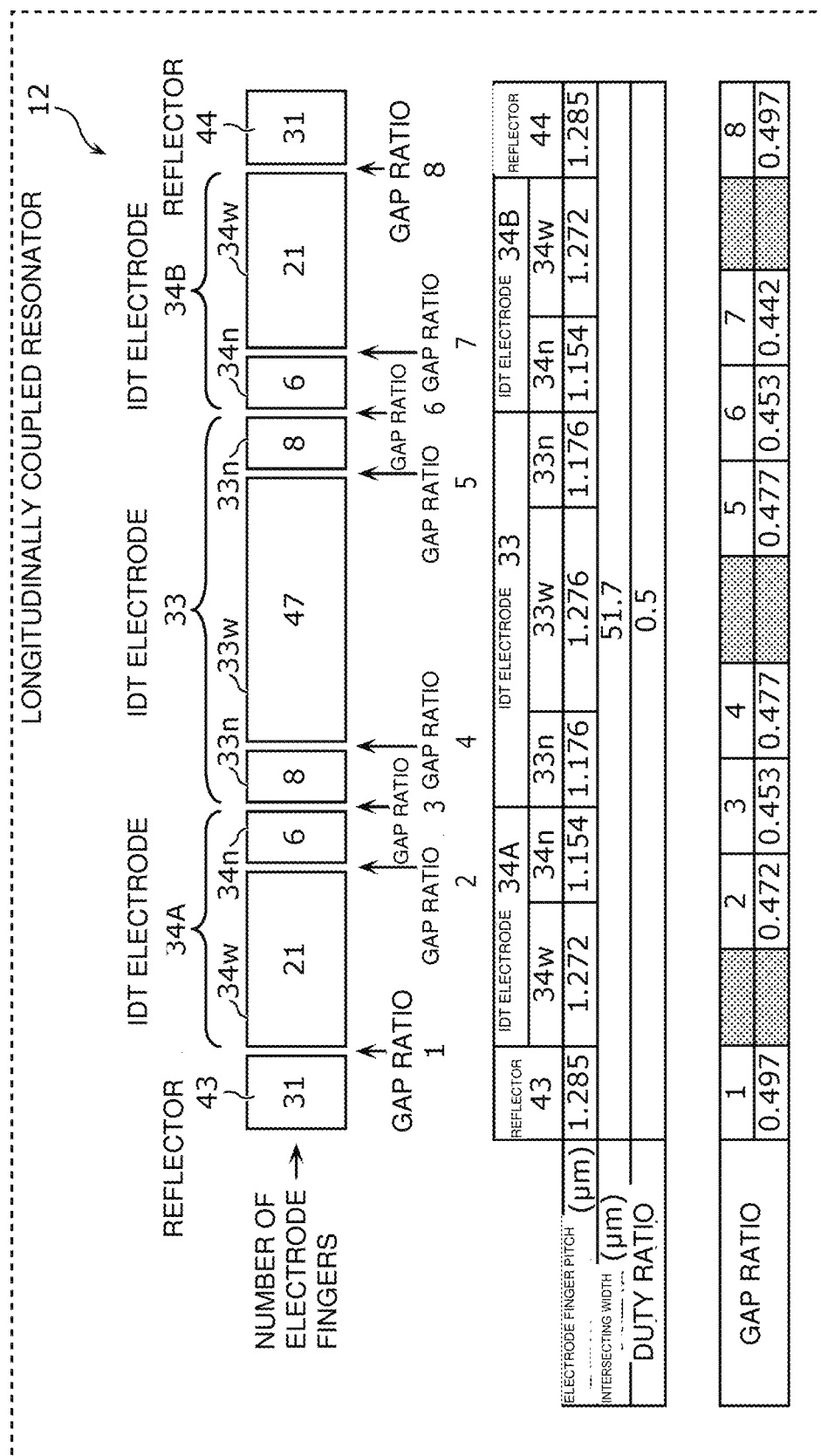
FIG. 6 is a diagram illustrating electrode parameters of the IDT electrode included in the longitudinally coupled resonator.

FIG. 6 is a diagram illustrating electrode parameters of the IDT electrode 30 of the longitudinally coupled resonator 12. Also, the figure illustrates the electrode parameters of the reflectors 43 and 44.

In this example, each pitch of the electrode fingers of the reflectors 43 and 44 is larger than the pitches of the electrode fingers of the IDT electrodes 33, 34A, and 34B. The pitch of the electrode fingers of the IDT electrode 33 is different from that of the electrode fingers of the IDT electrodes 34A and 34B. To be specific, the pitch of the electrode fingers of the wide pitch electrode finger group 33w is larger than the pitch of the electrode fingers of the wide pitch electrode finger group 34w, and the pitch of the electrode fingers of the narrow pitch electrode finger group 33n is larger than the pitch of the electrode fingers of the narrow pitch electrode finger group 34n. In the IDT electrodes 33, 34A, and 34B, the intersecting widths are the same, and the duties are the same. A gap ratio between the reflector and the IDT adjacent to each other in the second direction d2 is a value obtained by dividing the gap dimension between the reflector and the IDT by the wavelength of the reflector (twice the pitch of the electrode fingers). The gap dimension referred to here is the distance between the centers of two electrode fingers adjacent to each other in the boundary region between the reflector and the IDT and is determined from the mean value of the wavelength of the reflector and the wavelength of the IDT. The gap ratio between two IDTs adjacent to each other in the second direction d2 is a value obtained by dividing the gap dimension between the two IDTs by the wavelength of the reflector. The gap dimension referred to here is the distance between the centers of two electrode fingers adjacent to each other in the boundary region between two IDTs and is determined from the mean value of the wavelengths of the two IDTs.

Although the longitudinally coupled resonator 12 has been described above as an example, the IDT electrode of the longitudinally coupled resonator 11 also has electrode parameters similar to those described above. That is, the pitch of the electrode fingers of the reflectors 41 and 42 is larger than the pitches of the electrode fingers of the IDT electrodes 31, 32A, and 32B. The pitch of the electrode fingers of the IDT electrode 31 is different from that of the electrode fingers of the IDT electrodes 32A and 32B. To be specific, the pitch of the electrode fingers of the wide pitch electrode finger group 31w is larger than the pitch of the electrode fingers of the wide pitch electrode finger group 32w, and the pitch of the electrode fingers of the narrow pitch electrode finger group 31n is larger than the pitch of the electrode fingers of the narrow pitch electrode finger group 32n. In the IDT electrodes 31, 32A, and 32B, the intersecting widths are the same, and the duties are the same. Each gap ratio in the longitudinally coupled resonator 11 is the same as that in the longitudinally coupled resonator 12.

As described above, the longitudinally coupled resonator 11 differs from the longitudinally coupled resonator 12 in the number of electrode fingers included in the wide pitch electrode finger group. Hereinafter, an example will be described in which the number of electrode fingers of the wide pitch electrode finger group 31w is different from the number of electrode fingers of the wide pitch electrode finger group 33w, and the number of electrode fingers of the wide pitch electrode finger group 32w is different from the number of electrode fingers of the wide pitch electrode finger group 34w.

FIGS. 7A to 7D are diagrams illustrating transmission characteristics of the longitudinally coupled resonator group 10.

The figures illustrate the insertion loss of the longitudinally coupled resonator group 10 viewed from the input/output terminal T1 side. In addition, the figures also illustrate a first ripple Rp1, a second ripple Rp2, a third ripple Rp3, and a fourth ripple Rp4 that appear in the pass band of the longitudinally coupled resonator group 10.

The first ripple Rp1 and the second ripple Rp2 are unnecessary waves (SH ripples) that appear when the longitudinally coupled resonator group 10 is excited in an SV mode. A plurality of ripples appears because the wavelengths of the IDT electrodes are different. In this example, the ripples Rp1 and Rp2 appear in a band between the ripple Rp3 and the ripple Rp4 and closer to the center frequency than the ripples Rp3 and Rp4. The ripple Rp1 appears in a lower frequency band than the ripple Rp2.

The third ripple Rp3 and the fourth ripple Rp4 are unnecessary waves (phase difference-causing ripples) caused by a difference in phase between the longitudinally coupled resonators 11 and 12. A plurality of ripples appears because the wavelengths of the IDT electrodes are different. In this example, the ripple Rp3 appears in a lower frequency band than the ripples Rp4, Rp2, and Rp1. The ripple Rp4 appears in a higher frequency band than the ripples Rp3, Rp1, and Rp2.

Figure 7A:
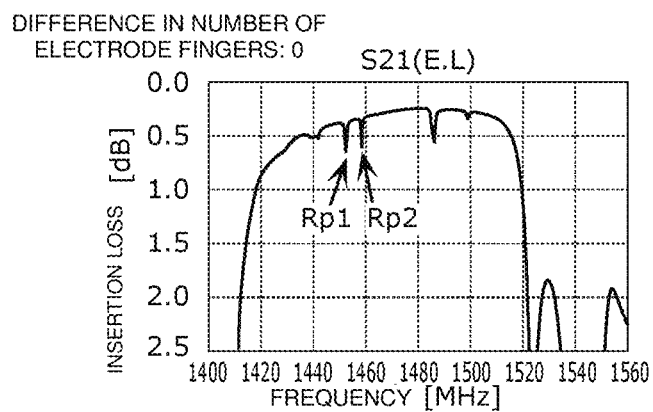
FIGS. 7A to 7D are diagrams illustrating transmission characteristics of the longitudinally coupled resonator group.

FIG. 7A illustrates the insertion loss when the difference in the number of electrode fingers between the wide pitch electrode finger group 31w and the wide pitch electrode finger group 33w is 0, and when the difference in the number of electrode fingers between the wide pitch electrode finger group 32w and the wide pitch electrode finger group 34w is 0. In this example, the ripples Rp1 and Rp2 occur in the pass band of the longitudinally coupled resonator group 10.

Figure 7B:
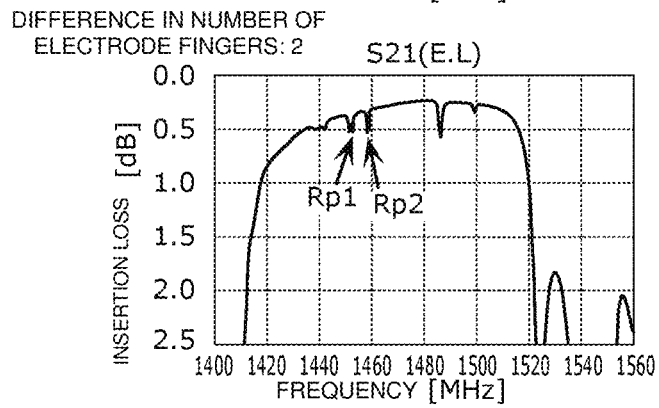

FIG. 7B illustrates the insertion loss when the number of electrode fingers of the wide pitch electrode finger group 31w is smaller than the number of electrode fingers of the wide pitch electrode finger group 33w by two and when the number of electrode fingers of the wide pitch electrode finger group 32w is smaller than the number of electrode fingers of the wide pitch electrode finger group 34w by two. In this example, the occurrence of the ripples Rp1 and Rp2 is reduced or prevented as compared with the case where the difference in the number of electrode fingers is 0.

Figure 7C:
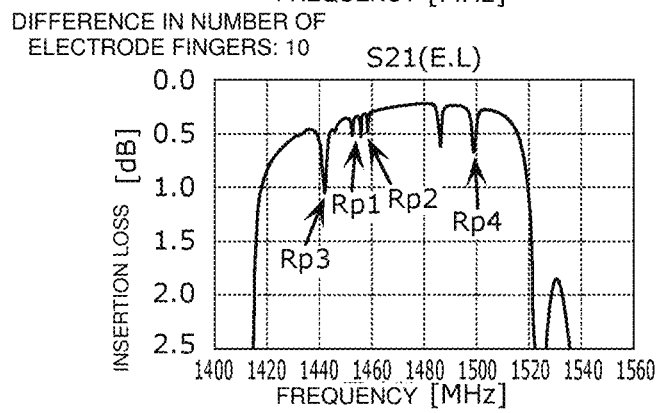

FIG. 7C illustrates the insertion loss when the number of electrode fingers of the wide pitch electrode finger group 31w is smaller than the number of electrode fingers of the wide pitch electrode finger group 33w by 10 and when the number of electrode fingers of the wide pitch electrode finger group 32w is smaller than the number of electrode fingers of the wide pitch electrode finger group 34w by 10. In this example, the occurrence of the ripples Rp1 and Rp2 are reduced or prevented, but the ripples Rp3 and Rp4 occur.

Figure 7D:
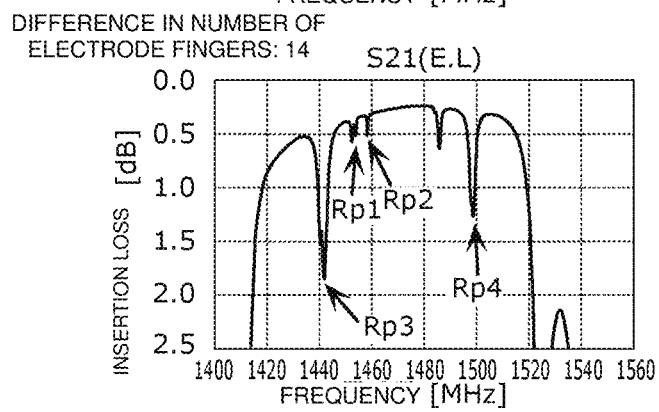

FIG. 7D illustrates the insertion loss when the number of electrode fingers of the wide pitch electrode finger group 31w is smaller than the number of electrode fingers of the wide pitch electrode finger group 33w by 14 and when the number of electrode fingers of the wide pitch electrode finger group 32w is smaller than the number of electrode fingers of the wide pitch electrode finger group 34w by 14. In this example, as compared with the case where the difference in the number of electrode fingers is 10, the ripples Rp1 and Rp2 are large, and the ripples Rp3 and Rp4 are even larger.

In this way, the magnitude of the ripples Rp1 and Rp2 can be changed by adjusting the number of electrode fingers in each of the wide pitch electrode finger groups 31w, 32w, 33w, and 34w. For example, as for the ripple Rp1, the magnitude of the ripples can be changed by fixing the number of electrode fingers of the wide pitch electrode finger group 33w and changing the number of electrode fingers of the wide pitch electrode finger group 31w. As for the ripple Rp2, the magnitude of the ripples can be changed by fixing the number of electrode fingers of the wide pitch electrode finger group 34w and changing the number of electrode fingers of the wide pitch electrode finger group 32w.

As for the ripples Rp3 and Rp4, the magnitude of the ripples can also be changed by adjusting the number of electrode fingers of the wide pitch electrode finger groups 31w, 32w, 33w, and 34w. For example, as for the ripple Rp3, the magnitude of the ripples can be changed by fixing the number of electrode fingers of the wide pitch electrode finger group 33w and changing the number of electrode fingers of the wide pitch electrode finger group 31w. As for the ripple Rp4, the magnitude of the ripples can be changed by fixing the number of electrode fingers of the wide pitch electrode finger group 34w and changing the number of electrode fingers of the wide pitch electrode finger group 32w.

Although an example in which the magnitudes of the ripples Rp1 and Rp2 appearing when the longitudinally coupled resonator group 10 is excited in the SV mode are changed has been described above, the present invention is not limited thereto. For example, also as for the unnecessary wave (SV ripple) that appears when the longitudinally coupled resonator group 10 is excited in an SH mode, the magnitude of the ripples can be changed in the same manner by adjusting the number of electrode fingers of the wide pitch electrode finger group.

Figure 8:
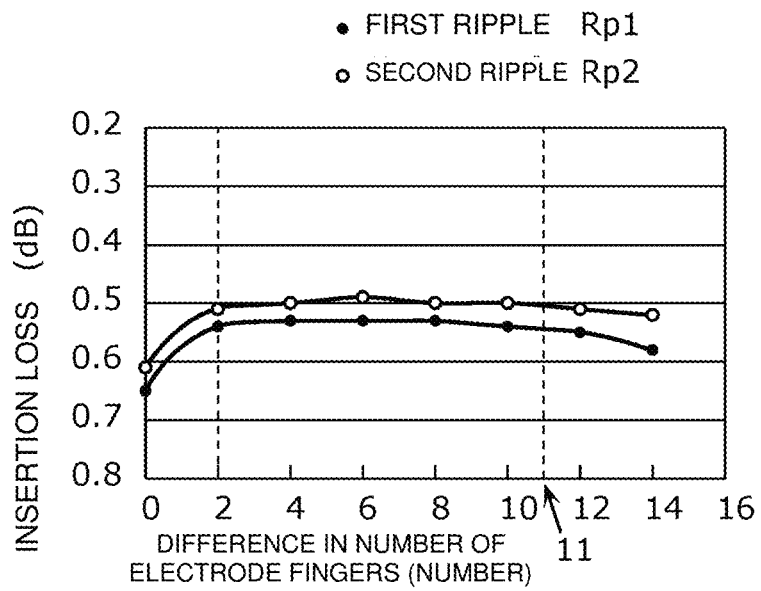
FIG. 8 is a diagram illustrating a relationship between a difference in the number of electrode fingers of a plurality of wide pitch electrode finger groups and magnitudes of a first ripple and a second ripple.

FIG. 8 is a diagram illustrating a relationship between a difference in the number of electrode fingers of a plurality of wide pitch electrode finger groups and the magnitudes of the first ripple Rp1 and the second ripple Rp2. The figure illustrates the worst value of the insertion loss of each of the ripples Rp1 and Rp2 when the difference in the number of electrode fingers is changed.

As illustrated in the figure, when the difference in the number of electrode fingers between the wide pitch electrode finger groups 31w and 33w is two, and when the difference in the number of electrode fingers between the wide pitch electrode finger groups 32w and 34w is two, the degree of change in the curvatures of the graph is large. Specifically, when the difference in the number of electrode fingers changes from one to two, the inclination of the tangent to the curve changes so as to decrease. In addition, when the difference in the number of electrode fingers between the wide pitch electrode finger groups 31w and 33w is 11, and when the difference in the number of electrode fingers between the wide pitch electrode finger groups 32w and 34w is 11, the degree of change in the curvatures of the graph is large. Specifically, when the difference in the number of electrode fingers changes from 11 to 12, the inclination of the tangent to the curve changes so as to increase in the negative direction.

From FIG. 8, it can be said that in order to reduce the insertion loss of each of the ripples Rp1 and Rp2, it is desirable that the difference in the number of electrode fingers of the wide pitch electrode finger groups 31w and 33w be two or more and 11 or less, and that the difference in the number of electrode fingers of the wide pitch electrode finger groups 32w and 34w be two or more and 11 or less.

Note that whether or not the degree of change in the curvature is large (whether or not the degree of change in the inclination of the tangent to the curve is large) is determined by, for example, whether or not the change in the insertion loss is equal to or less than a predetermined value when the number of electrode fingers is changed by one. In this example, it is determined that the degree of change in the curvature is small when the change in the insertion loss is equal to or less than about 0.5 dB, and that the degree of change in the curvature is large when the change in the insertion loss is larger than about 0.5 dB, for example.

Figure 9:
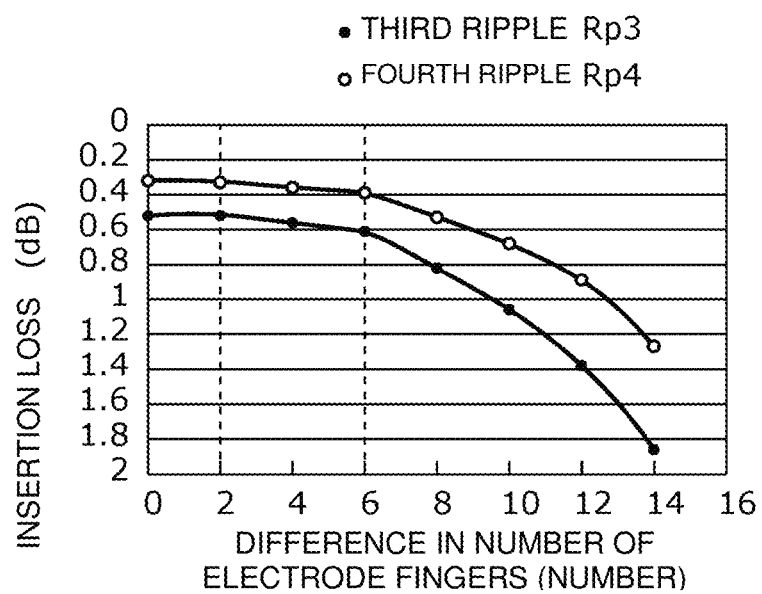
FIG. 9 is a diagram illustrating a relationship between a difference in the number of electrode fingers of the plurality of wide pitch electrode finger groups and magnitudes of a third ripple and a fourth ripple.

FIG. 9 is a diagram illustrating a relationship between a difference in the number of electrode fingers of a plurality of wide pitch electrode finger groups and the magnitudes of the third ripple Rp3 and the fourth ripple Rp4. The figure illustrates the worst value of the insertion loss of each of the ripples Rp3 and Rp4 when the difference in the number of electrode fingers is changed.

As illustrated in the figure, when the difference in the number of electrode fingers between the wide pitch electrode finger groups 31w and 33w is six, and when the difference in the number of electrode fingers between the wide pitch electrode finger groups 32w and 34w is six, the degree of change in the curvatures of the graph is large. Specifically, when the difference in the number of electrode fingers changes from six to seven, the inclination of the tangent to the curve changes so as to increase in the negative direction.

From FIG. 9, it can be said that in order to reduce the insertion loss of each of the ripples Rp3 and Rp4, it is desirable that the difference in the number of electrode fingers of the wide pitch electrode finger groups 31w and 33w be six or less, and the difference in the number of electrode fingers of the wide pitch electrode finger groups 32w and 34w be six or less.

Therefore, in order to reduce or minimize the insertion loss of all the ripples Rp1, Rp2, Rp3, and Rp4, it is desirable that the difference in the number of electrode fingers of the wide pitch electrode finger groups 31w and 33w be two or more and six or less, and the difference in the number of electrode fingers between the wide pitch electrode finger groups 32w and 34w be two or more and six or less.

When the case where the difference in the number of electrode fingers is two or more and six or less is applied to (Equation 1) described above, in the relationship between the IDT electrodes 31 and 33, the ratio of the number of electrode fingers to be reduced from the reference is equal to or more than about 0.042 and equal to or less than about 0.128 (=equal to or more than 2/47 and equal to or less than 6/47, where the fourth decimal place is rounded down at the lower limit and rounded up at the upper limit), for example. Therefore, the number of electrode fingers included in the wide pitch electrode finger group 31w of the IDT electrode 31 is preferably smaller than the number of electrode fingers included in the wide pitch electrode finger group 33w of the IDT electrode 33, as a reference, by a number falling within a range of equal to or more than about 4.2% and equal to or less than about 12.8%, for example. As a result, the occurrence of the ripples Rp1 and Rp3 can be reduced or prevented.

Similarly, when applied to (Equation 1), in the relationship between the IDT electrodes 32A and 34B, the ratio of the number of electrode fingers to be reduced from the reference is equal to or more than about 0.095 and equal to or less than about 0.286 (=equal to or more than 2/21 and equal to or less than 6/21, where the fourth decimal place is rounded down at the lower limit and rounded up at the upper limit), for example. Therefore, the number of electrode fingers included in the wide pitch electrode finger group 32w of the IDT electrode 32A is preferably smaller than the number of electrode fingers included in the wide pitch electrode finger group 34w of the IDT electrode 34A, as a reference, by a number falling within a range of equal to or more than about 9.5% and equal to or less than about 28.6%, for example. As a result, the occurrence of the ripples Rp2 and Rp4 can be reduced or prevented.

Similarly, when applied to (Equation 1), in the relationship between the IDT electrodes 32A and 34B, the ratio of the number of the electrode fingers to be reduced from the reference is equal to or more than about 0.095 and equal to or less than about 0.286 (=equal to or more than 2/21 and equal to or less than 6/21, where the fourth decimal place is rounded down at the lower limit and rounded up at the upper limit), for example. Therefore, the number of electrode fingers included in the wide pitch electrode finger group 32w of the IDT electrode 32A is preferably smaller than the number of electrode fingers included in the wide pitch electrode finger group 34w of the IDT electrode 34A, as a reference, by a number falling within a range of equal to or more than about 9.5% and equal to or less than about 28.6%, for example. As a result, the occurrence of the ripples Rp2 and Rp4 can be reduced or prevented.

Modification of Preferred Embodiment

A configuration of an acoustic wave filter 1A according to a modification of a preferred embodiment will be described with reference to FIG. 10.

Figure 10:
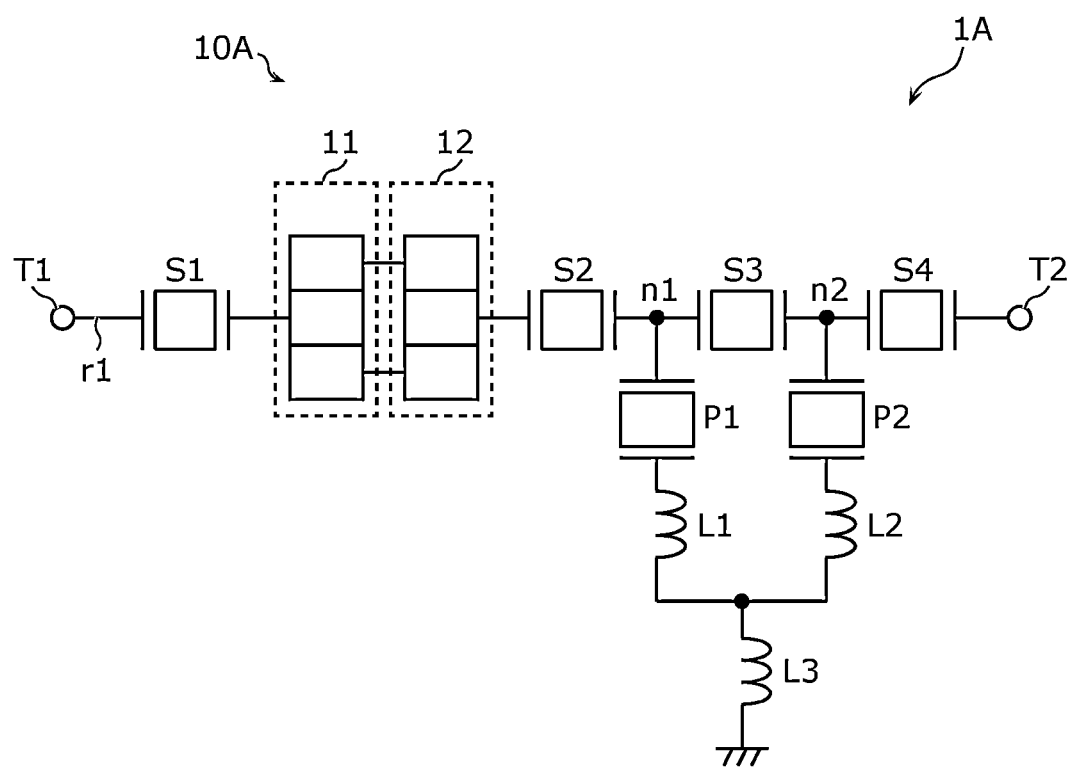
FIG. 10 is a circuit configuration diagram of an acoustic wave filter according to a modification of a preferred embodiment of the present invention.

FIG. 10 is a circuit configuration diagram of an acoustic wave filter 1A according to a modification of a preferred embodiment.

The acoustic wave filter 1A of the modification is a filter having the first frequency band as a pass band. The acoustic wave filter 1A is provided on the path r1 connecting the input/output terminals T1 and T2.

The acoustic wave filter 1A includes the plurality of series arm resonators S1, S2, S3, and S4, a longitudinally coupled resonator group 10A including the plurality of longitudinally coupled resonators 11 and 12, and the plurality of parallel arm resonators P1 and P2.

The longitudinally coupled resonator group 10A has the first longitudinally coupled resonator 11 and the second longitudinally coupled resonator 12 that are connected to each other. The first longitudinally coupled resonator 11 and the second longitudinally coupled resonator 12 of the modification are connected in series.

The longitudinally coupled resonator 11 includes the first IDT electrode 31 and the second IDT electrodes 32A and 32B. The longitudinally coupled resonator 12 includes the third IDT electrode 33 and the fourth IDT electrodes 34A and 34B.

In the acoustic wave filter 1A of the modification, similar to the above-described preferred embodiment, the number of electrode fingers included in the wide pitch electrode finger group 31w of the IDT electrode 31 is smaller than the number of electrode fingers included in the wide pitch electrode finger group 33w of the IDT electrode 33, as a reference, by a number falling within a range of equal to or more than about 4.2% and equal to or less than about 23.5%, for example. In addition, the number of the electrode fingers included in the wide pitch electrode finger group 32w of the IDT electrode 32A is smaller than the number of the electrode fingers included in the wide pitch electrode finger group 34w of the IDT electrode 34A, as a reference, by a number falling within a range of equal to or more than about 9.5% and equal to or less than about 52.4%, for example. In addition, the number of the electrode fingers included in the wide pitch electrode finger group 32w of the IDT electrode 32B is smaller than the number of the electrode fingers included in the wide pitch electrode finger group 34w of the IDT electrode 34B, as a reference, by a number falling within a range of equal to or more than about 9.5% and equal to or less than about 52.4%, for example.

According to these configurations, unnecessary waves generated when the IDT electrodes of the longitudinally coupled resonator 11 and the IDT electrodes of the longitudinally coupled resonator 12 are excessively excited than is necessary can be appropriately dispersed in the pass band of the acoustic wave filter 1A. Thus, the occurrence of ripples in the pass band of the acoustic wave filter 1A can be reduced or prevented.

SUMMARY

As described above, the acoustic wave filters 1 and 1A according to the present preferred embodiments may have the following aspects.

Aspect 1

The acoustic wave filter includes a plurality of longitudinally coupled resonators. The plurality of longitudinally coupled resonators include the first longitudinally coupled resonator 11 and the second longitudinally coupled resonator 12 that are connected to each other. Each of the first longitudinally coupled resonator 11 and the second longitudinally coupled resonator 12 includes the three IDT electrodes 30 that include a plurality of electrode fingers extending in the first direction d1 along the main surface of the substrate 320 and aligned in the second direction d2 intersecting the first direction d1. The first longitudinally coupled resonator 11 includes the three IDT electrodes 30 provided along the second direction d2, and of the three IDT electrodes 30, the first IDT electrode 31 is at the center in the second direction d2, and the second IDT electrode 32A is adjacent to the first IDT electrode 31. The second longitudinally coupled resonator 12 includes the three IDT electrodes 30 provided along the second direction d2, and of the three IDT electrodes 30, the third IDT electrode 33 is at the center in the second direction d2, and the fourth IDT electrode 34A is adjacent to the third IDT electrode 33. Each of the IDT electrodes 30 includes a wide pitch electrode finger group with a pitch equal to or larger than the mean value Pi of the pitches of the plurality of electrode fingers and a narrow pitch electrode finger group with a pitch less than the mean value Pi.

The acoustic wave filter has at least one of the following configurations (1) and (2).
(1) The number of electrode fingers included in the wide pitch electrode finger group 31w of the first IDT electrode 31 is smaller than the number of electrode fingers included in the wide pitch electrode finger group 33w of the third IDT electrode 33, as a reference, by a number falling within a range of equal to or more than about 4.2% and equal to or less than about 23.5%, for example.

(2) The number of electrode fingers included in the wide pitch electrode finger group 32w of the second IDT electrode 32A is smaller than the number of electrode fingers included in the wide pitch electrode finger group 34w of the fourth IDT electrode 34A, as a reference, by a number falling within a range of equal to or more than about 9.5% and equal to or less than about 52.4%, for example.

According to the configuration described in (1), unnecessary waves generated when the IDT electrode 31 and the IDT electrode 33 are excessively excited than is necessary can be appropriately dispersed in the pass band of the acoustic wave filter. Thus, occurrence of ripples in the pass band of the acoustic wave filter can be reduced or prevented.

According to the configuration described in (2), unnecessary waves generated when the IDT electrode 32A and the IDT electrode 34A are excessively excited than is necessary can be appropriately dispersed in the pass band of the acoustic wave filter. Thus, occurrence of ripples in the pass band of the acoustic wave filter can be reduced or prevented.

Note that when the acoustic wave filter includes the IDT electrode 32B instead of the IDT electrode 32A, the same effect can be obtained even when the IDT electrode 32A described above is replaced with the IDT electrode 32B. When the acoustic wave filter includes the IDT electrode 34B instead of the IDT electrode 34A, the same effect can be obtained even when the IDT electrode 34A described above is replaced with the IDT electrode 34B.

Aspect 2

The acoustic wave filter according to Aspect 1 has at least one of the following configurations (3) and (4).

(3) The number of electrode fingers included in the wide pitch electrode finger group 31w of the first IDT electrode 31 is smaller than the number of electrode fingers included in the wide pitch electrode finger group 33w of the third IDT electrode 33, as a reference, by a number falling within a range of equal to or more than about 4.2% and equal to or less than about 12.8%, for example.

(4) The number of electrode fingers included in the wide pitch electrode finger group 32w of the second IDT electrode 32A is smaller than the number of electrode fingers included in the wide pitch electrode finger group 34w of the fourth IDT electrode 34, as a reference, by a number falling within a range of equal to or more than about 9.5% and equal to or less than about 28.6%, for example.

According to the configuration described in (3), unnecessary waves generated when the IDT electrode 31 and the IDT electrode 33 are excessively excited than is necessary can be further dispersed in the pass band of the acoustic wave filter. Thus, occurrence of ripples in the pass band of the acoustic wave filter can be reduced or prevented.

According to the configuration described in (4), unnecessary waves generated when the IDT electrode 32A and the IDT electrode 34A are excessively excited than is necessary can be further dispersed in the pass band of the acoustic wave filter. Thus, occurrence of ripples in the pass band of the acoustic wave filter can be reduced or prevented.

Note that when the acoustic wave filter includes the IDT electrode 32B instead of the IDT electrode 32A, the same effect can be obtained even when the IDT electrode 32A is replaced with the IDT electrode 32B. When the acoustic wave filter includes the IDT electrode 34B instead of the IDT electrode 34A, the same effect can be obtained even when the IDT electrode 34A is replaced with the IDT electrode 34B.

Aspect 3

In the acoustic wave filter according to Aspect 1 or 2, the number of electrode fingers of the first IDT electrode 31 is larger than the number of electrode fingers of the second IDT electrode 32. The number of electrode fingers of the third IDT electrode 33 is larger than the number of electrode fingers of the fourth IDT electrode 34.

According to this configuration, among a plurality of ripples occurring in the pass band, ripples caused by the first IDT electrode 31 and the third IDT electrode 33 can be effectively reduced or prevented.

Aspect 4

In the acoustic wave filter according to any one of Aspects 1 to 3, the first longitudinally coupled resonator 11 includes one first IDT electrode 31 and two second IDT electrodes 32A and 32B, and the first IDT electrode 31 is arranged between the two second IDT electrodes 32A and 32B. The second longitudinally coupled resonator 12 includes one third IDT electrode 33 and two fourth IDT electrodes 34A and 34B, and the third IDT electrode 33 is arranged between the two fourth IDT electrodes 34A and 34B.

According to this configuration, unnecessary waves generated when the IDT electrode 32A and the IDT electrode 34A are excessively excited than is necessary can be appropriately dispersed in the pass band of the acoustic wave filter, and unnecessary waves generated when the IDT electrode 32B and the IDT electrode 34B are excessively excited than is necessary can be appropriately dispersed in the pass band of the acoustic wave filter. Thus, occurrence of ripples in the pass band of the acoustic wave filter can be reduced or prevented.

Aspect 5

In the acoustic wave filter according to any one of Aspects 1 to 4, the first longitudinally coupled resonator 11 and the second longitudinally coupled resonator 12 are connected in parallel.

According to this configuration, unnecessary waves generated when the first longitudinally coupled resonator 11 and the second longitudinally coupled resonator 12 connected in parallel are excessively excited than is necessary can be appropriately dispersed in the pass band of the acoustic wave filter. Thus, occurrence of ripples in the pass band of the acoustic wave filter can be reduced or prevented.

Aspect 6

In the acoustic wave filter according to any one of Aspects 1 to 4, the first longitudinally coupled resonator 11 and the second longitudinally coupled resonator 12 are connected in series.

According to this configuration, unnecessary waves generated when the first longitudinally coupled resonator 11 and the second longitudinally coupled resonator 12 connected in series are excessively excited than is necessary can be appropriately dispersed in the pass band of the acoustic wave filter. Thus, occurrence of ripples in the pass band of the acoustic wave filter can be reduced or prevented.

Aspect 7

In the acoustic wave filter according to any one of Aspects 1 to 6, the first longitudinally coupled resonator 11 and the second longitudinally coupled resonator 12 are excited in the SV mode.

According to this configuration, unnecessary waves generated when the first longitudinally coupled resonator 11 and the second longitudinally coupled resonator 12 are excited in the SV mode can be appropriately dispersed in the pass band of the acoustic wave filter. Thus, occurrence of ripples in the pass band of the acoustic wave filter can be reduced or prevented.

Aspect 8

In the acoustic wave filter according to any one of Aspects 1 to 6, the first longitudinally coupled resonator 11 and the second longitudinally coupled resonator 12 are excited in the SH mode.

According to this configuration, unnecessary waves generated when the first longitudinally coupled resonator 11 and the second longitudinally coupled resonator 12 are excited in the SH mode can be appropriately dispersed in the pass band of the acoustic wave filter. Thus, occurrence of ripples in the pass band of the acoustic wave filter can be reduced or prevented.

Other Preferred Embodiments

Although the acoustic wave filters according to the preferred embodiments of the present invention has been described above, the present invention also includes other preferred embodiments achieved by combining elements or features in the above preferred embodiments, modifications obtained by applying various modifications conceived by those skilled in the art to the above preferred embodiments without departing from the scope of the present invention, and high-frequency front-end circuits and a communication devices including the acoustic wave filters according to preferred embodiments of the present invention.

Although an example in which the number of electrode fingers of the IDT electrode 31 is larger than that of the IDT electrodes 32A and 32B has been described above, the present invention is not limited to this example. The number of electrode fingers of the IDT electrode 31 may be smaller than that of the IDT electrodes 32A and 32B. The IDT electrodes 32A and 32B and the IDT electrode 31 may have the same number of electrode fingers. Although an example in which the number of electrode fingers of the IDT electrode 33 is larger than that of the IDT electrodes 34A and 34B has been described above, the present invention is not limited thereto. The number of electrode fingers of the IDT electrode 33 may be smaller than that of the IDT electrodes 34A and 34B. The IDT electrodes 34A and 34B and the IDT electrode 33 may have the same number of electrode fingers.

In the above description, the IDT electrodes 32A and 32B have the same number of electrode fingers but may have different numbers of electrode fingers. The IDT electrodes 34A and 34B have the same number of electrode fingers, but may have different numbers of electrode fingers.

Although an example in which the acoustic wave filter is a reception filter has been described above, the acoustic wave filter is not limited thereto and may be a transmission filter.

In addition, the materials of the electrode layer 325 and the dielectric layer 326 of the IDT electrode and the reflectors are not limited to the materials described above. The IDT electrode included in the IDT need not have a stacked structure. The IDT electrode may be made of, for example, a metal such as Ti, Al, Cu, Pt, Au, Ag, or Pd or an alloy thereof, or may include a plurality of multilayer bodies made of the above metal or the alloy.

In addition, although the substrate having piezoelectric properties is described as a substrate in the preferred embodiments, the substrate may be a piezoelectric substrate formed of a single layer of a piezoelectric layer. The piezoelectric substrate in this case is made of, for example, a piezoelectric single crystal of $LiTaO_3$ or another piezoelectric single crystal such as $LiNbO_3$. In addition, the substrate on which the IDT electrode is formed, as long as it has piezoelectric properties, may use a structure in which a piezoelectric layer is stacked on a support substrate, in addition to a structure in which the entire substrate is formed of a piezoelectric layer. Further, the cut angle of the substrate according to the above preferred embodiments is not limited. In other words, the stacked structures, materials, and thicknesses may be changed as appropriate in accordance with the required bandpass characteristics of the acoustic wave filter, and the same effects can be obtained even in the surface acoustic wave filter using a $LiTaO_3$ piezoelectric substrate or a $LiNbO_3$ piezoelectric substrate having a cut angle other than the cut angle shown in the above-described preferred embodiments.

The piezoelectric substrate 100 may have a structure in which a support substrate, a high acoustic velocity film, a low acoustic velocity film, and a piezoelectric layer are stacked in this order.

The material of the low acoustic velocity film is not limited to the above, and for example, a dielectric such as glass, silicon oxide, silicon oxynitride, lithium oxide, tantalum oxide, or a compound obtained by adding fluorine, carbon, or boron to silicon oxide, or a material including the above material as a main component can be used.

The material of the high acoustic velocity film is not limited to the above, and for example, piezoelectric materials such as aluminum nitride, lithium tantalate, lithium niobate, and quartz; ceramics such as alumina, sapphire, magnesia, silicon nitride, silicon carbide, zirconia, cordierite, mullite, steatite, forsterite, spinel, and sialon; dielectrics such as aluminum oxide, silicon oxynitride, diamond-like carbon (DLC), and diamond; semiconductors such as silicon; or materials including the above materials as a main component can be used.

Note that the above spinel includes an aluminum compound including oxygen and one or more elements selected from Mg, Fe, Zn, Mn, and the like. Examples of the above spinel include $MgAl_2O_4$, $FeAl_2O_4$, $ZnAl_2O_4$ and $MnAl_2O_4$.

As for the material of the support substrate, piezoelectric materials such as aluminum nitride, lithium tantalate, lithium niobate, and quartz; ceramics such as alumina, sapphire, magnesia, silicon nitride, silicon carbide, zirconia, cordierite, mullite, steatite, and forsterite; dielectrics such as diamond and glass; semiconductors such as silicon and gallium nitride; resins; or materials including the above materials as a main component can be used.

In this specification, the term "main component" refers to a component that accounts for more than 50% by weight.

A film of an arbitrary material may be present between the respective layers within a range that does not greatly affect the propagating surface acoustic wave. For example, a new high acoustic velocity film that is sufficiently thinner than the wavelength of the surface acoustic wave may be formed between the piezoelectric film and the low acoustic velocity film. This new high acoustic velocity film may be made of the same material as the above-described high acoustic velocity film.

Preferred embodiments of the present invention are widely applicable to communication devices such as mobile phones as acoustic wave filters, front-end circuits, and communication devices each including a filter including a longitudinally coupled resonator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
a plurality of longitudinally coupled resonators; wherein
the plurality of longitudinally coupled resonators includes a first longitudinally coupled resonator and a second longitudinally coupled resonator that are connected to each other;
each of the first longitudinally coupled resonator and the second longitudinally coupled resonator includes three IDT electrodes that include a plurality of electrode fingers extending in a first direction along a main surface of a substrate and aligned in a second direction intersecting the first direction;
the first longitudinally coupled resonator includes the three IDT electrodes provided along the second direction, a first IDT electrode of the three IDT electrodes is at a center in the second direction, and a second IDT electrode of the three IDT electrodes is adjacent to the first IDT electrode;
the second longitudinally coupled resonator includes the three IDT electrodes provided along the second direction, a third IDT electrode of the three IDT electrodes is at a center in the second direction, and a fourth IDT electrode is adjacent to the third IDT electrode;
each of the IDT electrodes includes a wide pitch electrode finger group with a pitch equal to or larger than a mean value of pitches of the plurality of electrode fingers, and a narrow pitch electrode finger group with a pitch less than the mean value; and
a number of the electrode fingers included in the wide pitch electrode finger group of the first IDT electrode is smaller than a number of the electrode fingers included in the wide pitch electrode finger group of the third IDT electrode by a percentage within a range of equal to or more than about 4.2% and equal to or less than about 23.5%; and/or
a number of the electrode fingers included in the wide pitch electrode finger group of the second IDT electrode is smaller than a number of the electrode fingers included in the wide pitch electrode finger group of the fourth IDT electrode by a percentage within a range of equal to or more than about 9.5% and equal to or less than about 52.4%.

2. The acoustic wave filter according to claim 1, wherein the number of the electrode fingers included in the wide pitch electrode finger group of the first IDT electrode is smaller than the number of the electrode fingers included in the wide pitch electrode finger group of the third IDT electrode by a percentage within a range of equal to or more than about 4.2% and equal to or less than about 12.8%; and/or
the number of the electrode fingers included in the wide pitch electrode finger group of the second IDT electrode is smaller than the number of the electrode fingers included in the wide pitch electrode finger group of the fourth IDT electrode by a percentage within a range of equal to or more than about 9.5% and equal to or less than about 28.6%.

3. The acoustic wave filter according to claim 1, wherein the number of the electrode fingers of the first IDT electrode is greater than the number of the electrode fingers of the second IDT electrode; and the number of the electrode fingers of the third IDT electrode is greater than the number of the electrode fingers of the fourth IDT electrode.

4. The acoustic wave filter according to claim 1, wherein the first longitudinally coupled resonator includes the one first IDT electrode and the two of the second IDT electrodes; the first IDT electrode is between the two of the second IDT electrodes;
the second longitudinally coupled resonator includes the one third IDT electrode and two of the fourth IDT electrodes; and
the third IDT electrode is between the two of the fourth IDT electrodes.

5. The acoustic wave filter according to claim 1, wherein the first longitudinally coupled resonator and the second longitudinally coupled resonator are connected in parallel.

6. The acoustic wave filter according to claim 1, wherein the first longitudinally coupled resonator and the second longitudinally coupled resonator are connected in series.

7. The acoustic wave filter according to claim 1, wherein the first longitudinally coupled resonator and the second longitudinally coupled resonator are excited by an SV mode.

8. The acoustic wave filter according to claim 1, wherein the first longitudinally coupled resonator and the second longitudinally coupled resonator are structured to be excited in an SH mode.

9. The acoustic wave filter according to claim 1, wherein the acoustic wave filter is a reception filter with a pass band in a downlink frequency band.

10. The acoustic wave filter according to claim 1, wherein the substrate is a piezoelectric substrate.

11. The acoustic wave filter according to claim 10, further comprising a dielectric layer covering the plurality of electrode fingers.

12. The acoustic wave filter according to claim 1, wherein the substrate is a $LiNbO_3$ substrate (lithium niobate substrate) having a cut angle of about 127.5°.

13. The acoustic wave filter according to claim 1, wherein each of the first longitudinally coupled resonator and the second longitudinally coupled resonator includes reflectors outside of the IDT electrodes.

14. The acoustic wave filter according to claim 1, wherein pitches between electrode fingers of the reflectors are larger than pitches of the electrode fingers of the IDT electrodes.

15. The acoustic wave filter according to claim 1, wherein the substrate is a piezoelectric substrate including a support substrate, a high acoustic velocity film, a low velocity acoustic velocity film, and a piezoelectric layer.

16. The acoustic wave filter according to claim 15, wherein the high acoustic velocity film includes a piezoelectric material, a ceramic material, a dielectric material, or a semiconductor material.

17. The acoustic wave filter according to claim 15, wherein the low acoustic velocity film includes a dielectric material or a compound including silicon oxide and one of fluorine, carbon, or boron.

18. The acoustic wave filter according to claim 15, wherein the support substrate includes a piezoelectric material, a ceramic material, a dielectric material, a semiconductor material, or a resin material.

19. The acoustic wave filter according to claim 1, wherein the acoustic wave filter is a transmission filter.

20. A communication device comprising the acoustic wave filter according to claim 1.

* * * * *